United States Patent [19]

Roof

[11] Patent Number: 4,791,350
[45] Date of Patent: Dec. 13, 1988

[54] CURRENT REGULATED SWITCHING REGULATOR FOR GATING GATE TURNOFF DEVICES

[75] Inventor: Richard W. Roof, Lexington, S.C.

[73] Assignee: Square D Company, Palatine, Ill.

[21] Appl. No.: 9,044

[22] Filed: Jan. 27, 1987

Related U.S. Application Data

[63] Continuation of Ser. No. 677,729, Dec. 4, 1984.

[51] Int. Cl.$^4$ .............................................. G05F 1/575
[52] U.S. Cl. ..................................... 323/284; 307/571
[58] Field of Search .................... 307/252 C; 323/282, 323/284

[56] References Cited

U.S. PATENT DOCUMENTS

| | | | |
|---|---|---|---|
| 3,294,981 | 12/1966 | Bose | 323/285 |
| 3,368,139 | 2/1968 | Wuerflein | 323/286 |
| 3,383,584 | 5/1968 | Atherton | 323/286 |
| 3,417,321 | 12/1968 | Clapp | 323/286 |
| 4,160,945 | 7/1979 | Schorr | 323/288 |
| 4,203,047 | 5/1980 | Seki | 323/282 |
| 4,253,055 | 2/1981 | Gatten | 323/284 |
| 4,292,550 | 9/1981 | Onda et al. | 307/252 C |
| 4,321,526 | 3/1982 | Weischedel | 323/284 |
| 4,350,948 | 9/1982 | Meroni | 323/282 |
| 4,456,872 | 6/1984 | Froeschle | 323/286 |

FOREIGN PATENT DOCUMENTS

0211617 12/1985 Japan ................................ 323/282

OTHER PUBLICATIONS

Bösterling et al., "GTO's: Their Properties and Applications", A.E.G. Technical Information, Oct. '83.
Japanese Engineering Sheet UCZ-82-00012.
Burgum et al. "Gate Turn-Off Switch", Electronic Components and Applications, vol. 2, No. 4.
International Rectifier Data Sheet PD-7.005A.
Pavek et al., "Switching Regulator", IBM Bulletin, vol. 16, No. 12, May 1974, pp. 3911-3912.

*Primary Examiner*—Patrick R. Salce
*Assistant Examiner*—Jeffrey Sterrett
*Attorney, Agent, or Firm*—A. Sidney Johnston; Richard T. Guttman

[57] ABSTRACT

The invention is a current regulator having a source of electric current, a switch connected in series with the source of electric current, and a load receiving current through the switch from the source of current. Means are provided for sensing the current through the load, and means responsive to the current through the load turn the switch on and off so that the average current through the load has a predetermined value. A filter smooths out the variations in the current. An inductor and a diode serve as the filter. A gate turn on thyristor (GTO) control electrode serves as the load and the current regulator maintains the control current needed to sustain conduction of the GTO. The current regulator is incorporated in an inverter using GTO devices to generate AC drive current for a motor.

7 Claims, 6 Drawing Sheets

CURRENT REGULATED SWITCHING REGULATOR FOR GATING GATE TURNOFF DEVICES

This application is a continuation of application Ser. No. 677,729, filed on Dec. 4, 1984.

This invention relates to regulated current supplies, and particularly to switching regulators for supplying an average current value.

BACKGROUND OF THE INVENTION

A long standing problem in electronic circuit design is to supply a predetermined value of average direct current to a load without wasting excessive amounts of electrical energy in a series resistor. Particularly, it is important to supply a gate turn off thyristor with a predetermined current during the conduction phase of the GTO. Previous solutions to supplying a GTO with a control current during conduction have required dissipation of undue amounts of electrical energy in a series resistor. Switching regulators of the prior art have been either excessively complicated or otherwise unsuitable for incorporation in commercial electronic products. Examples of complex switching regulators include U.S. Pat. No. 3,383,584, issued to Atherton on May 14, 1968, and U.S. Pat. No. 4,160,945, issued to Schorr on July 10, 1979. Other switching regulators have been devised for voltage control but are unsuitable for control of current flow into a device requiring a predetermined input current, and representative of these devices is U.S. Pat. No. 3,417,321, issued to Clapp on Dec. 17, 1968.

SUMMARY OF THE INVENTION

The invention is a simple, inexpensive regulator for providing a predetermined average current flow to a device. The invention is a current regulator having a source of electric current, a switch connected in series with the source of electric current, and a load receiving current through the switch from the source of current. Means are provided for sensing the current through the load, and means responsive to the current through the load turn the switch on and off so that the average current through the load has a predetermined value.

Other and further aspects of the present invention will become apparent during the course of the following description and by reference to the accompanying drawings.

BRIEF DESCRIPTION OF THE DRAWINGS

Referring now to the drawings, in which like numerals represent like parts in the several views.

DETAILED DESCRIPTION

Figure 1:
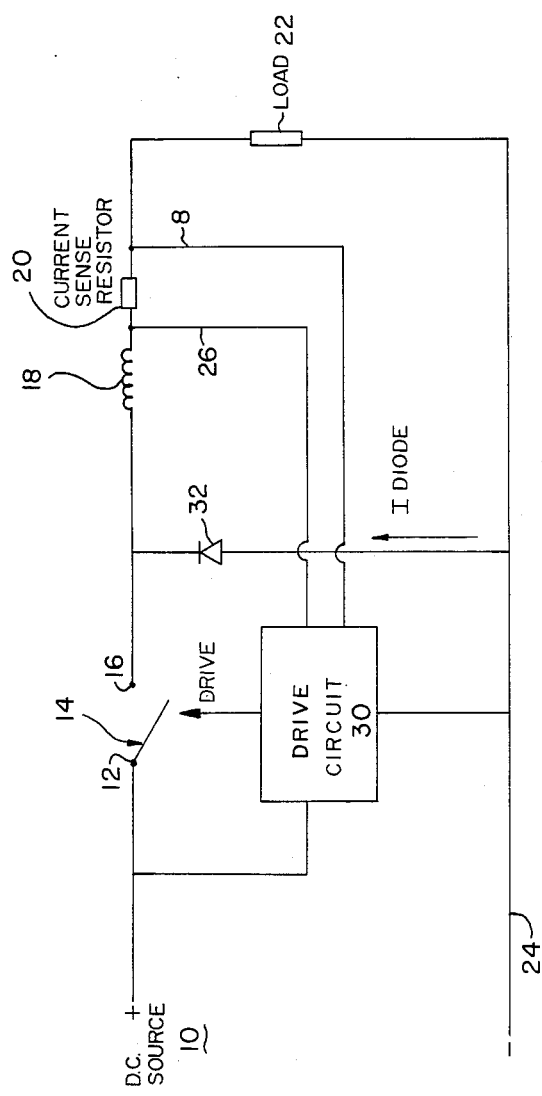
FIG. 1 is a current regulated switching regulator.

FIG. 1 shows a partial schematic and block diagram of a current regulated switching regulator. DC source of voltage 10 connects to a first terminal 12 of switch 14, and a second terminal 16 of switch 14 connects to inductor 18. Inductor 18 connects to current source resistor 20 which in turn connects to load 22. Load 22 connects to negative terminal 24 of DC source of voltage 10. A voltage developed across current sense resistor 20 connects through leads 26 and 28 to drive circuit 30. Drive circuit 30 also connects to both the positive terminal of DC source 10 and the negative terminal of DC source 10. The drive circuit responds to the voltage developed across current sense resistor 20, and turns switch 14 on and off so that the average current through current sense resistor 20 has a predetermined value.

Switch 14 is operated in "on" or "off" mode by drive circuit 30. When switch 14 turns "off", inductor 18 maintains a current. The current maintained by inductor 18 passages through current sense resistor 20, load 22, and through diode 32. Inductor 18 serves as a filter to smooth out changes in load 22 current when switch 14 turns on and off.

Figure 2:
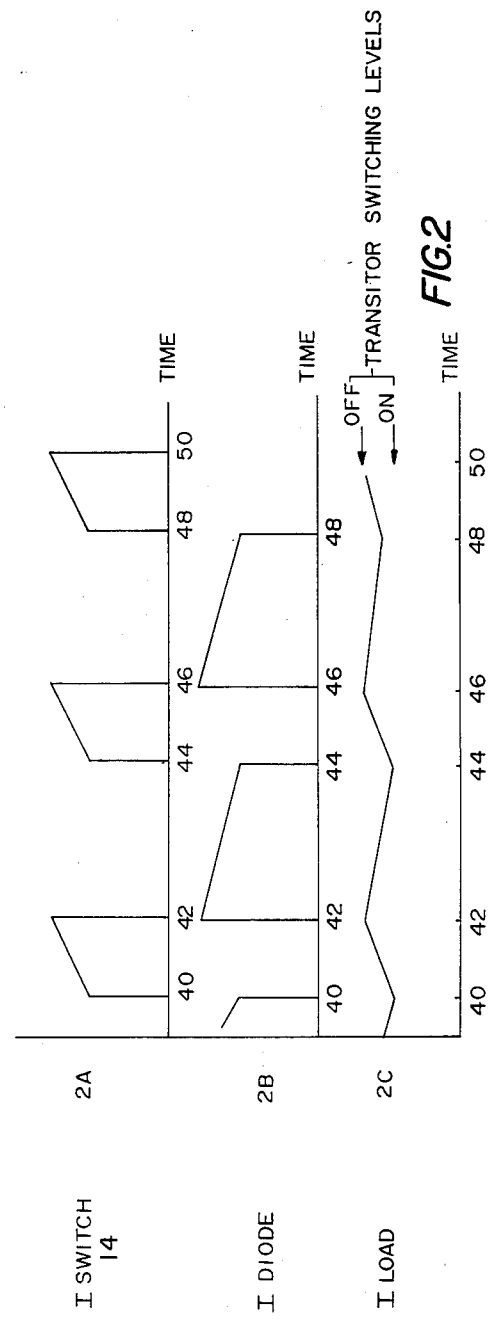
FIG. 2 is a graph of waveforms occurring within a current regulated switching regulator.

FIG. 2 is a series of graphs showing idealized waveforms within a current regulated switching regulator, as shown in FIG. 1. Graph 2A gives the load current through switch 14 as a function of time. The switch 14 is turned on by drive circuit 30 at time 40 and turned off by drive circuit 30 at time 42. Current builds up through switch 14 as a function of time as a result of the time constant associated with inductor 18. The on/off cycle of switch 14 is repeated at times 44 and 46, and also repeated at times 48 and 50.

The current through diode 32 is shown in graph 2B. The diode current drops to 0 at time 40 when switch 14 is turned on and remains at substantially 0 until time 42 when switch 14 is turned off. The current through diode 32 begins at time 42 at a maximum value and drops off to a minimum value at time 44. Diode 32 current arises as a result of the energy stored in inductor 18 being discharged in a circuit through current sense resistor 20, load 22, and diode 32. At time 44 switch 14 is again turned on by drive circuit 30, and diode 32 current drops to 0. The diode current remains at 0 until time 46, at which time switch 14 is switched off and diode current increases to an initial value, and then begins declining in accordance with a discharge time constant of inductor 18 until time 48. The current cycles of switch 14 and diode 32 are repeated in order to maintain a predetermined average load current in load 22.

Graph 2C shows the current through load 22 as a function of time. At time 40 the switch is turned on and current through load 22 begins increasing. The current through load 22 continues increasing until switch 14 is turned off at time 42. From time 42 through time 44 the current in load 22 decreases as inductor 18 discharges through load 22 and diode 32. At time 44 through time 46 the current in load 22 once again increases as switch 14 is conducting during time 44 through time 46. From time 46 through time 48 the current through load 22 once again decreases as inductor 18 discharges through load 22 and diode 32. The current through load 22 is seen to increase and decrease as the switch 14 is turned on and turned off. Switching levels are shown on graph 2C.

Switching levels are developed by drive circuit 30, through its detection of voltage developed across current sensor resistor 20. The "off" switching level, and the "on" switching level are chosen to provide a predetermined current variation in load 22. The difference between "on" and "off" switching levels is called hysteresis. The hysteresis is chosen large enough to prevent extremely rapid switching of switch 14, and chosen small enough so that current variations in load 22 are not excessive.

The inductance of inductor 18, the load resistance of load 22, the resistance of current sense resistor 20 and other resistances in the circuit determine the time constants for current rise and current decline through load 22.

Figure 3:
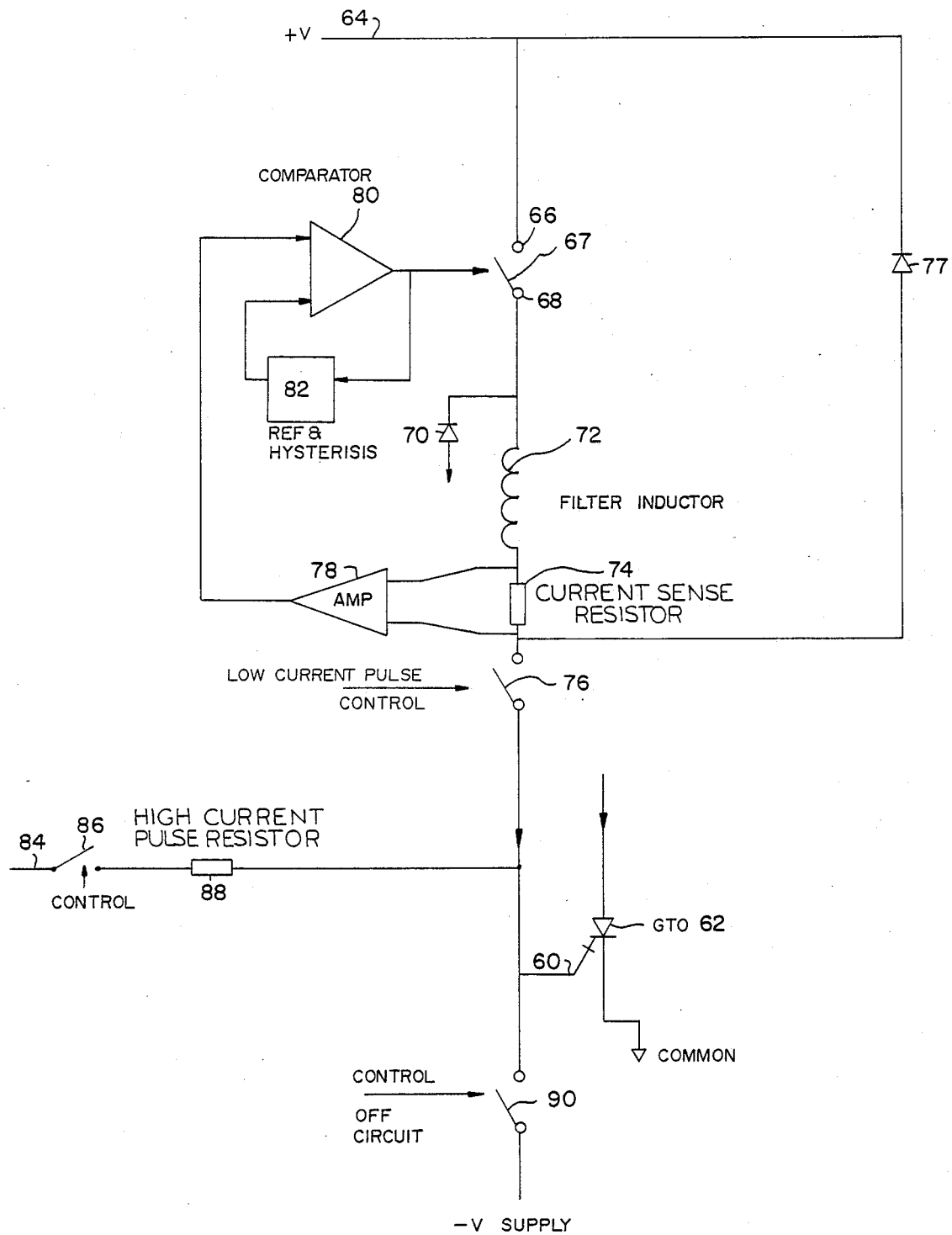
FIG. 3 is a current regulating switching regulator having a GTO as a load.
Figure 4:
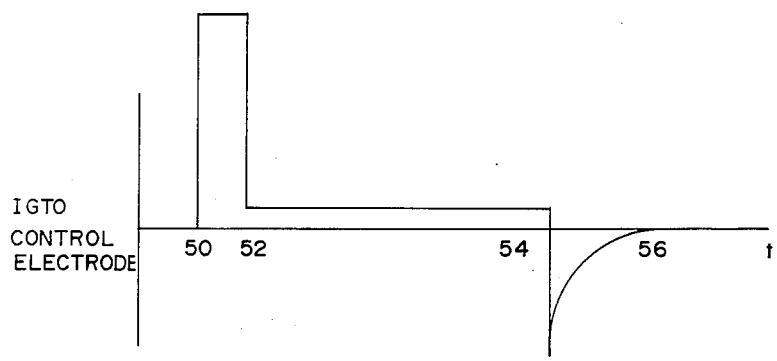
FIG. 4 is a graph of a GTO control pulse waveform.

FIG. 3 shows a current regulated switching regulator used to supply "on" current to a gate turn off thyristor (GTO). The waveform required by a GTO for stable operation is shown in FIG. 4. It is seen that the GTO requires a large current pulse in its control electrode during an initial time period 50 to 52 in order to turn the GTO on. Throughout the conduction period of the GTO, it is advantageous to supply a small amount of current to the GTO control electrode. Current supplied to the GTO during its long conduction phase is shown as the current during time 52 through time 54. When the GTO is to be turned "off", a negative voltage must be applied to the control electrode of the GTO causing a current pulse to flow. The negative current pulse is shown between times 54 and 56.

The current regulated switching regulator shown in FIG. 3 is used to supply the conduction phase control current to control electrode 60 of GTO 62. The conduction phase control current pulse is shown in FIG. 4 between time 52 and time 54. The positive terminal 64 of a DC voltage supply is connected to terminal 66 of an electronic switch 67. Terminal 68 of the electronic switch 67 connects to a diode 70 and a filter inductor 72. The filter inductor connects to current sense resistor 74. Current sense resistor 74 connects to a control switch 76, which when closed, permits current flow from terminal 64 to a load, for example the control electrode 60 of GTO 62. Current sense resistor 74 also connects to diode 77 which allows the current maintained by filter inductor 72 to return to terminal 64 when control switch 76 is opened. An amplifier 78 has its input connected to sense the voltage drop across current sense resistor 74. The output of amplifier 78 connects to one input terminal of comparator 80. The output of comparator 80 drives switch 67. The output of comparator 80 also is connected to a reference and hysteresis circuit 82. The output of reference and hysteresis circuit 82 connects to a second input terminal of comparator 80. Comparator 80 closes and opens switch 67 in order to achieve a predetermined average current through current sense resistor 74. Switch 14 shown in FIG. 1 corresponds to switch 67 shown in FIG. 3. Also, filter inductor 72 corresponds with filter inductor 18 shown in FIG. 1, as current sensor resistor 74 corresponds with current sense resistor 20 shown in FIG. 1. Also diode 70 corresponds with diode 32 shown in FIG. 1. Therefore, a predetermined average current such as is shown in Graph 2C of FIG. 2 may be maintained by switch 67 into control terminal 60 of GTO 62. The high current initial value of a control pulse to GTO 62, as between times 50 and 52 shown in FIG. 4, is supplied by voltage supply 84, control switch 86, and high current pulse limiting resistor 88. Switch 86 is closed during time period 50 through 52. Switch 76 is closed sometime in the time period from time 50 to 52. At time 52 switch 86 opens and switch 76 carries a low current to terminal 60 of GTO 62. At time 54 switch 76 is opened and switch 90 is closed applying a negative voltage to control electrode 60, thereby providing a negative current "turn off" pulse to GTO 62. Current flow through GTO 62 is extinguished by the negative current pulse between times 54 and 56.

Figure 5:
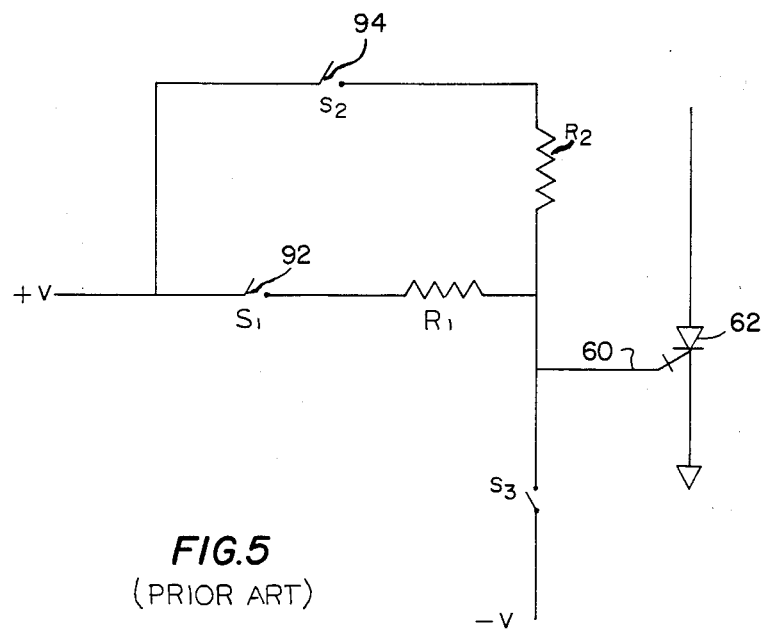
FIG. 5 is a prior art GTO current supply circuit.

A prior art circuit for supplying the turn on phase high current between times 50 and 52 to GTO 62 is shown in FIG. 5, and also a circuit for supplying the conduction phase current to GTO 62 between times 52 and 54. In operation, the prior art circuit has switch 92 closed at time 50 in order to supply a high current pulse during times 50 through 52. Also, switch 94 closes at time 50. At time 52 switch 92 opens thereby providing current flow to control lead 60 of GTO 62 through resistor R2 during the time period 52 through 54. Resistor R1 is chosen to provide the appropriate high turn on current magnitude, and resistor R2 is chosen to provide the conduction phase current between time 52 and time 54.

Figure 6:
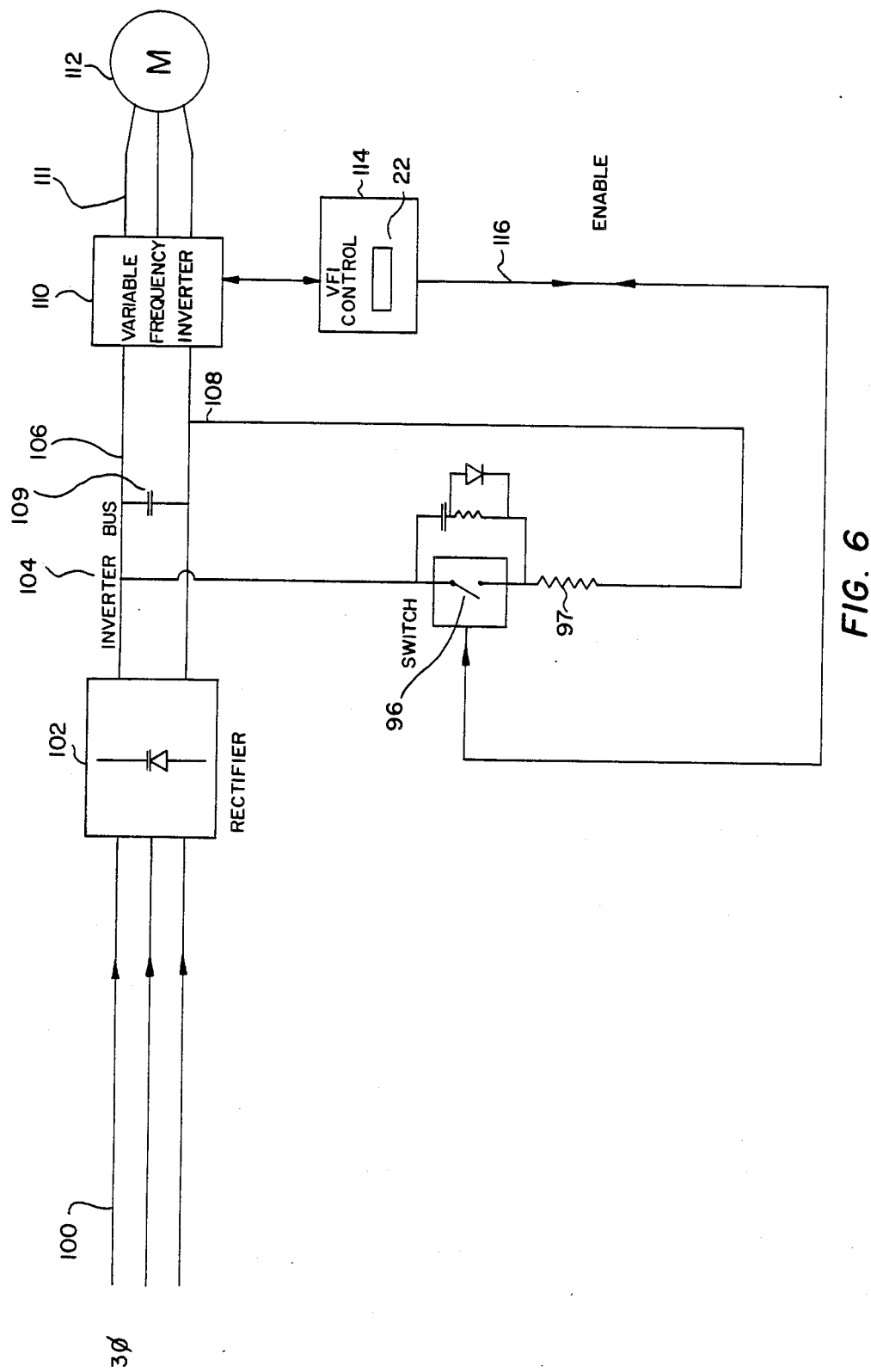
FIG. 6 is a block diagram of an inverter according to the invention.
Figure 7:
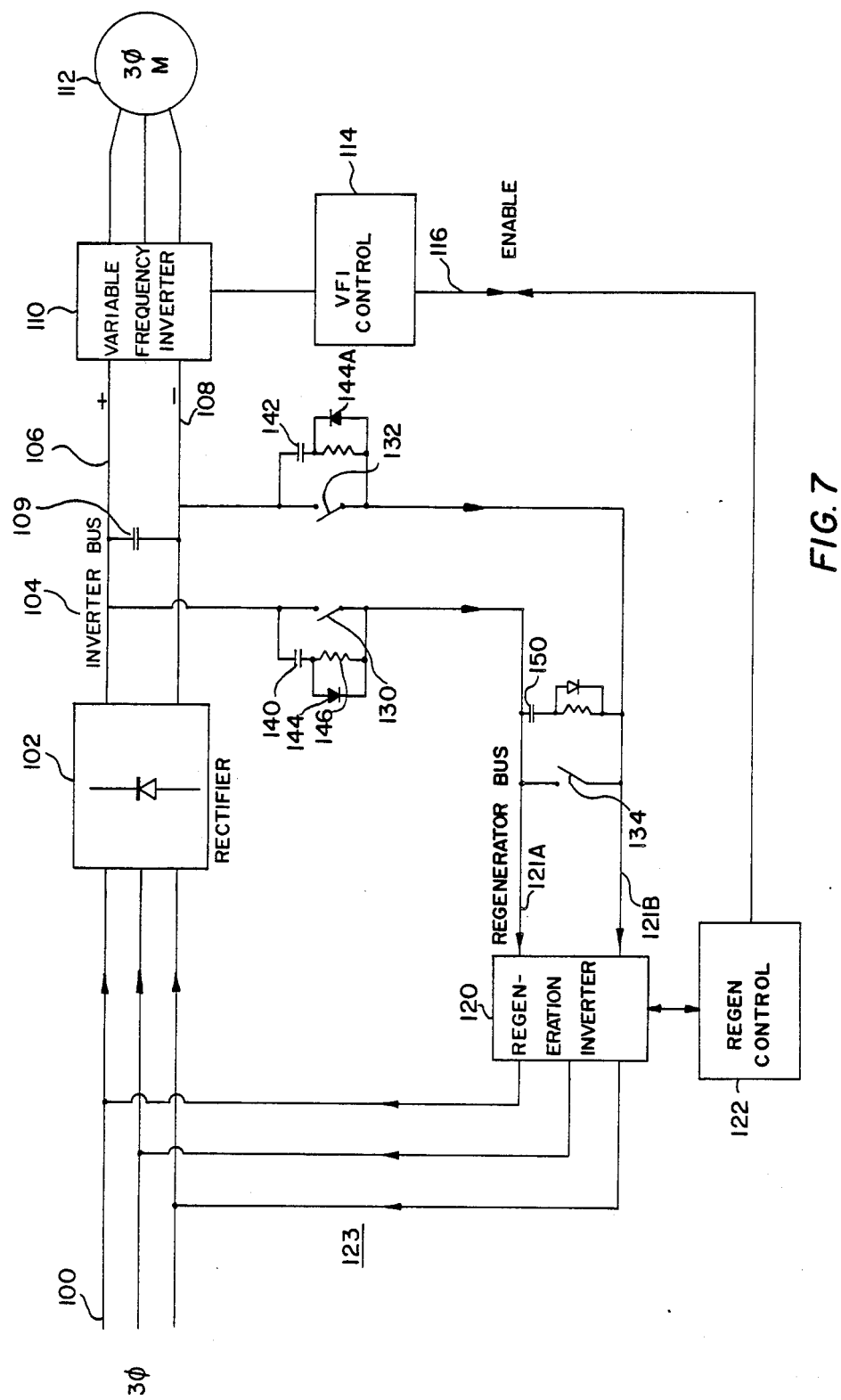
FIG. 7 is a block diagram of an inverter according to the invention.

FIG. 6 and FIG. 7 show the invention in use in a variable frequency inverter. In FIG. 6 and in FIG. 7, three phase AC power line 100 deliver electrical power to rectifier 102. Rectifier 102 delivers DC electrical power to bus 104. Bus 104 has a positive conductor 106 and a negative conductor 108. DC bus 104 delivers electrical power to variable frequency inverter 110. Variable frequency inverter 110 delivers AC electrical power to motor 112 through conductors 111. VFI control 114 controls variable frequency inverter 110. During periods of regeneration by motor 112, VFI 116 delivers an enable signal 116 to switch 96. Switch 96 closes and allows energy stored in bus capacitor 109 to dissipate in resistor 97. Switch 96 is protected by a capacitor, a resistor, and a diode from excessive rates of change of voltage as switch 96 opens. Switch 96 is operated by an enable signal on line 116.

In FIG. 7 enable signal 116 activates regen control 122. Regen control 122 controls regeneration inverter 120. Regeneration inverter 20 draws DC power from DC bus 104 and converts it into alternating current. The alternating current produced by regeneration inverter 120 is connected through conductors 123 to AC power line 100. Regeneration inverter 120 delivers the AC electrical power it generates to three phase AC power line 100. Switches 130, 132, and 134 provide positive turn off of solid state switches within regeneration inverter 120, thereby allowing regeneration inverter 120 to be commutated properly for delivery of AC power to three phase AC power line 100 at a substantially unit power factor. Capacitors 140, 150, and 142 protect their respective switches from excessive rates of change of voltage.

Switches such as switch 14, switch 67, switch 76, switch 90, switch 92, and switch 94 are preferably electronic switches. For example, transistors or field effect transistors may be used for these switches.

Switches 96, 130, 132, and 134 may conveniently employ gate turn off thyristors. Also GTOs are useful for generating AC power in variable frequency inverter 110. The advantage of using GTO devices is so that they may be turned off by the negative pulse shown in FIG. 4 between times 54 and 56.

Various features of AC inverter designs incorporating the invention disclosed herein are more fully disclosed in the following U.S. patent applications, and all of which are filed on even date with the within application for U.S. patent: "DC Bus Shorting Apparatus and Method for AC Inverter", Inventors, J. C. Guyeska, J. M. Liptak, R. W. Roof, Ser. No. 677,709, all disclosures of which are incorporated herein by reference; "DC Bus Voltage Regulation by Controlling the Frequency in a Variable Frequency Inverter", Inventor, F. C. Joyner, Jr., Ser. No. 677,730, all disclosures of which are incorporated herein by reference; and "Regeneration Detector Circuit", Inventor, J. M. Liptak, Ser. No. 677,785, all disclosures of which are incorporated herein by reference.

Figure 8:
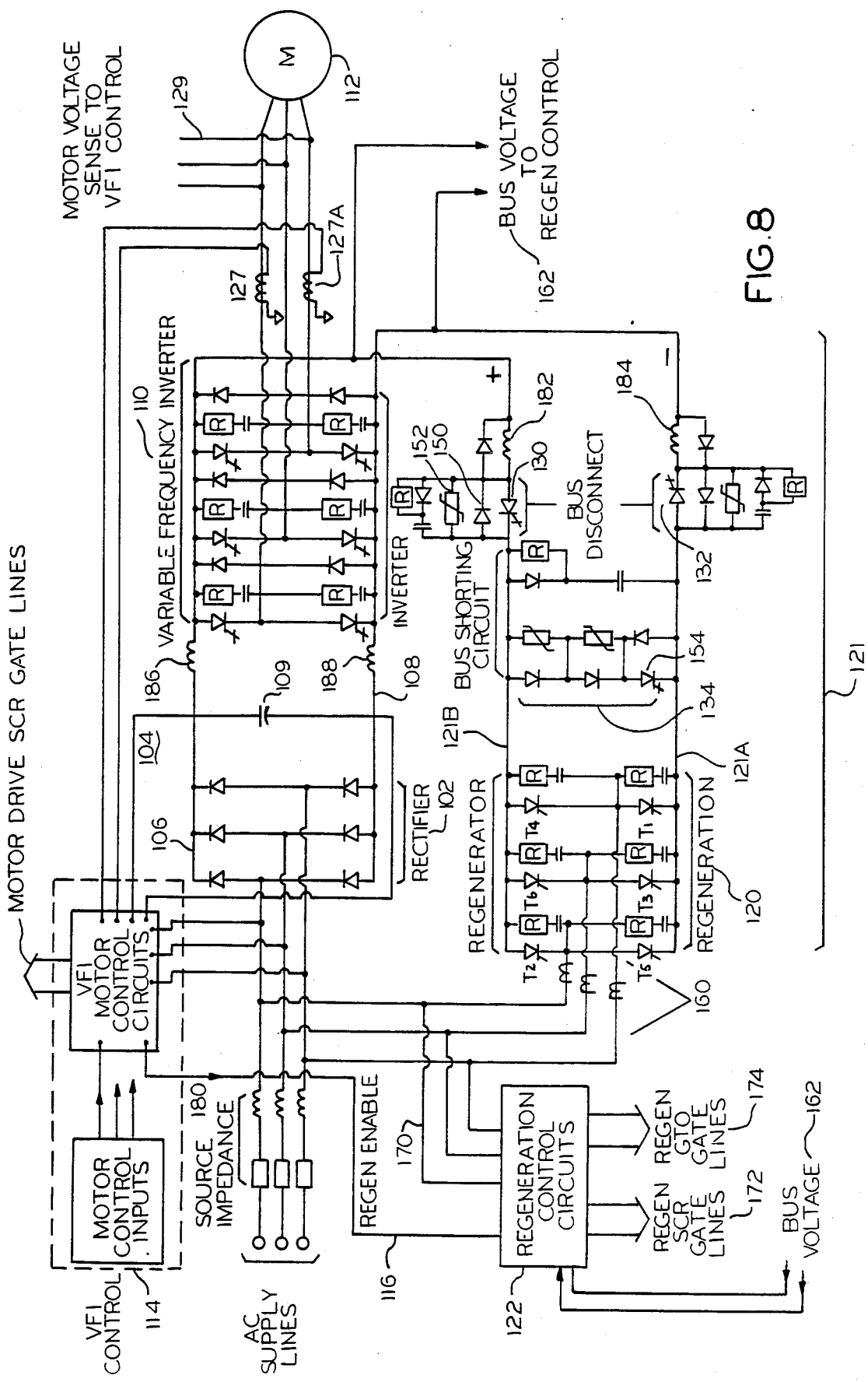
FIG. 8 is a schematic diagram of an inverter system.

FIG. 8 shows more details of the power flow circuits. Rectifier 102 is made of six solid state diodes in a full wave circuit, and the diodes connect to positive bus conductor 106 and negative bus conductor 108. The variable frequency inverter 110 has solid state switches. The solid state switches can be gate turnoff thyristors or transistors, or other solid state switchable devices. Each solid state switch is protected by a snubber capacitor and resistor.

Each solid state switch has a diode connected across it in anti-parallel. These diodes provide a current path for the conditions where motor 112 requires reactive current or generates electrical power flow into DC bus 104.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A gate current supply for a control electrode of a gate turn off thyristor (GTO) comprising:
    a source of direct electric current;
    a switch connected in series with said source of direct electric current, said control electrode of said GTO receiving current through said switch from said source of direct electric current;
    means for sensing said current received by said control electrode;
    comparator means responsive to said current received by said control electrode for turning said switch on and off so that the average current received by said control electrode has a predetermined value; and
    a reference and hysteresis circuit connected to said comparator means for adjusting said average current received by said control electrode to said predetermined value, and for switching said switch on at a predetermined low current value, and for switching said switch off at a predetermined high current value.

2. The apparatus as in claim 1 further comprising:
    a filter for smoothing out irregularities in said current received by said control electrode.

3. The apparatus as in claim 2 wherein said filter comprises:
    an inductor in series with said source of direct electric current;
    a diode operationally connected to permit current flow from the discharge of energy stored in said inductor when said switch is turned off so that current flow occurs from said inductor through said control electrode and through said diode.

4. An apparatus as in claim 1 wherein said means for sensing said current received by said GTO control electrode comprises:
    a resistor in series with said source of direct electric current;
    an operational amplifier having inputs connected to sense a voltage developed across said resistor.

5. An apparatus as in claim 1 wherein:
    said sensing means includes a resistor in series with said source of direct electric current; and
    an operational amplifier having inputs connected to sense a voltage developed across said resistor; and
    said comparator means has a first input connected to said output of said operational amplifier, a second input connected to said reference and hysteresis circuit, and an output of said comparator connected to said switch for driving said switch on and off in order to drive said switch on at said predetermined low current value, and in order to drive said switch off at said predetermined high current value.

6. A gate current regulator comprising:
    a source of electric current;
    a switch connected in series with said source of electric current;
    a gate electrode of a gate turn off thyristor receiving current through said switch from said source of electric current;
    means for sensing said current through said gate electrode;
    comparator means responsive to said current through said gate electrode for turning said switch on and off so that the average current through said gate electrode has a predetermined value; and,
    a reference and hysteresis circuit connected to said comparator means for adjusting said average current through said gate electrode to said predetermined value, and for switching said switch on at a predetermined low current value, and for switching said switch off at a predetermined high current value.

7. A variable frequency inverter comprising:
    a plurality of gate turn off thyristors (GTO), each having a control electrode for switching electric current;
    a source of direct electric current;
    a switch connected in series with said source of direct electric current, said control electrode of said GTO receiving current through said switch from said source of direct electric current;
    means for sensing said current received by said control electrode;
    comparator means responsive to said current received by said control electrodes for turning said switch on and off so that the average current received by said control electrodes has a predetermined value; and,
    a reference and hysteresis circuit connected to said comparator means for adjusting said average current through said control electrode to said predetermined value, and for switching said switch on at a predetermined low current value, and for switching said switch off at a predetermined high current value.

* * * * *